United States Patent [19]

Kawakami

[11] Patent Number: 4,920,393
[45] Date of Patent: Apr. 24, 1990

[54] INSULATED-GATE FIELD-EFFECT SEMICONDUCTOR DEVICE WITH DOPED REGIONS IN CHANNEL TO RAISE BREAKDOWN VOLTAGE

[75] Inventor: Masumi Kawakami, Miho, Japan

[73] Assignee: Texas Instruments Incorporated, Dallas, Tex.

[21] Appl. No.: 310,497

[22] Filed: Feb. 13, 1989

Related U.S. Application Data

[63] Continuation of Ser. No. 1,789, Jan. 8, 1987, abandoned.

[51] Int. Cl.⁵ .................. H01L 29/90; H01L 29/78
[52] U.S. Cl. .................... 357/23.8; 357/13; 357/53; 357/23.3; 357/23.1
[58] Field of Search ............ 357/23.8, 23.3, 23.1, 357/53, 13

[56] References Cited

U.S. PATENT DOCUMENTS

| | | | |
|---|---|---|---|
| 3,427,514 | 2/1969 | Olmstead | 357/23.14 |
| 3,436,622 | 4/1969 | Warner | 357/23.14 |
| 3,882,409 | 5/1975 | Yagi | 357/23.14 |
| 4,033,797 | 7/1977 | Dill et al. | 357/23.9 |
| 4,172,260 | 10/1979 | Okabe | 357/23.8 |
| 4,247,860 | 1/1981 | Tihanyi | 357/20 |
| 4,288,802 | 9/1981 | Ronen | 357/53 |

FOREIGN PATENT DOCUMENTS

| | | | |
|---|---|---|---|
| 54-22177 | 2/1979 | Japan | 357/23.12 |
| 57-23271 | 2/1982 | Japan | 357/23.3 |
| 61-185973 | 8/1986 | Japan | 357/23.3 |

OTHER PUBLICATIONS

Krick et al., *IBM TDB*, "Integratable . . . Structure", vol. 15, No. 6, Nov. 1972, pp. 1884–1885.

*Primary Examiner*—Andrew J. James
*Assistant Examiner*—Jerome Jackson, Jr.
*Attorney, Agent, or Firm*—N. Rhys Merrett; Melvin Sharp; James T. Comfort

[57] ABSTRACT

An insulated-gate field-effect semiconductor device comprising a silicon substrate of a first conductivity type, heavily doped source and drain regions of a second conductivity type in the substrate, a plurality of island regions of the second conductivity type in the substrate, the heavily doped island regions being located between the source and drain regions, a gate oxide layer on the surface of the substrate, and a conductive layer having a portion on the gate oxide layer, the portion of the conductive layer being coextensive with the area of the substrate which intervenes between the source and regions. The conductive layer may have apertures respectively aligned with the island regions in the substrate and the conductive layer may be formed to be extensive throughout the area of the substrate which intervenes between the first and second heavily doped regions.

15 Claims, 3 Drawing Sheets

INSULATED-GATE FIELD-EFFECT SEMICONDUCTOR DEVICE WITH DOPED REGIONS IN CHANNEL TO RAISE BREAKDOWN VOLTAGE

This application is a continuation, of application Ser. No. 001,789, filed Jan. 8, 1987 now abandoned.

FIELD OF THE INVENTION

The present invention relates to an insulated-gate field-effect semiconductor device such as, typically, a metal-oxide-semiconductor field-effect transistor (hereinafter referred to as MOSFET).

BACKGROUND OF THE INVENTION

In an insulated-gate field-effect semiconductor device such as a MOSFET, it is sometimes observed that, as the drain voltage is increased beyond the saturation region, a point is reached where the drain current begins to increase abruptly. The device then enters a mode which is broadly known in the art as an avalanche breakdown mode which takes place in high-field regions between the gate and drain of the device. This kind of phenomenon is one of the most important disadvantages of known semiconductor devices such as transistors with high breakdown voltage performances.

In order to eliminate such a disadvantage of a prior-art insulated-gate field-effect semiconductor device, there have been proposed and put to use some types of MOSFET devices offering improved drain breakdown voltage characteristics. As will be discussed in more detail, some important problems are however encountered in fabricating such advanced versions of prior-art insulated-gate field-effect semiconductor devices. Such problems include achieving the low amplifier gains of the devices and establishing the complicated process steps required for the fabrication of the devices. The present invention thus contemplates provision of a further improved insulated-gate field-effect semiconductor device eliminating such problems of prior-art insulated-gate field-effect semiconductor devices and a process of fabricating such an improved insulated-gate field-effect semiconductor device.

It is, accordingly an important object of the present invention to provide an insulated-gate field-effect semiconductor device offering improved drain breakdown voltage characteristics.

It is another important object of the present invention to provide an insulated-gate field-effect semiconductor device adapted to achieve satisfactory amplifier gains in addition to the improved drain breakdown voltage characteristics.

It is still another important object of the present invention to provide an insulated-gate field-effect semiconductor device which features the ease of fabrication as well as the improved drain breakdown voltage characteristics and the satisfactory amplifier gains.

SUMMARY OF THE INVENTION

In accordance with one outstanding aspect of the present invention, there is provided an insulated-gate field-effect semiconductor device comprising a) a semiconductor layer of a first conductivity type, the semiconductor layer having a surface portion, (b) first and second heavily doped regions of a second conductivity type in the semiconductor layer, the second conductivity type being opposite to the first conductivity type, the first and second heavily doped regions being spaced apart from each other along the surface portion of the semiconductor layer, (c) at least one heavily doped island region of the second conductivity type in the semiconductor layer, the heavily doped island region being located between the first and second heavily doped regions, and (d) a conductive layer having a portion substantially coextensive with the area of the semiconductor layer which intervenes between the first and second heavily doped regions. In a semiconductor device thus constructed in accordance with the present invention, the conductive layer may have an aperture or apertures substantially aligned with the island region or regions in the semiconductor layer or, alternatively, the conductive layer may be formed to be extensive substantially throughout the area of the semiconductor layer which intervenes between the first and second heavily doped regions.

BRIEF DESCRIPTION OF THE DRAWINGS

The drawbacks of a prior-art insulated-gate field-effect semiconductor device and the features and advantages of a insulated-gate field-effect semiconductor device according to the present invention will be more clearly understood from the following description taken in conjunction with the accompanying drawings in which.

DESCRIPTION OF THE PRIOR ART

Figure 1:
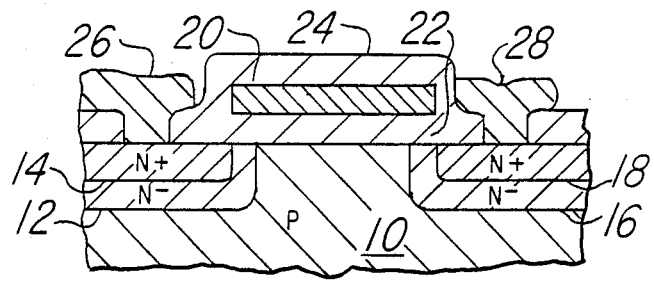
FIG. 1 is a fragmentary sectional view showing a typical example of a prior-art MOSFET device designed to provide improved drain breakdown voltage characteristics.
Figure 2:
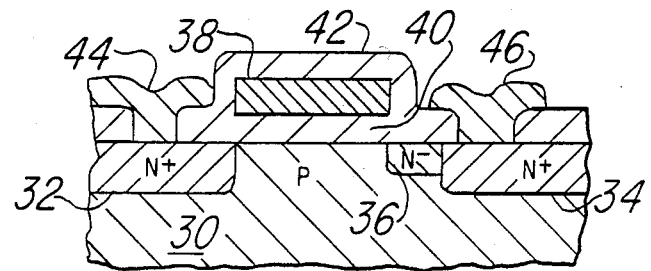
FIG. 2 is a view similar to FIG. 1 but shows another example of a prior-art MOSFET device designed to provide improved drain breakdown voltage characteristics.
Figure 3:
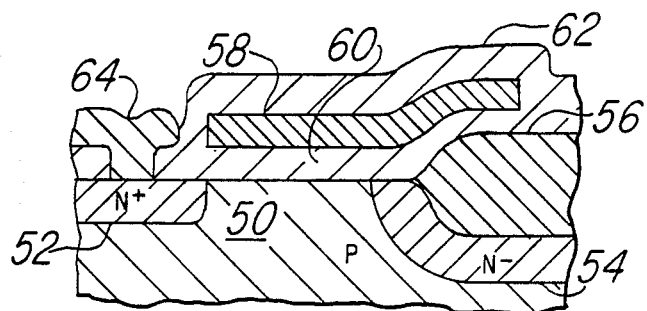
FIG. 3 is a view also similar to FIG. 1 but shows still another example of a prior-art MOSFET device designed to provide improved drain breakdown voltage characteristics.

FIGS. 1 to 3 show typical examples of prior-art MOSFET devices designed to achieve improved drain breakdown voltage characteristics.

The structure shown in FIG. 1 is a MOSFET device of the type known as lightly-doped drain (LDD) transistor device and includes a p-type substrate 10 having dual-layer source and drain regions. The source region is formed by the combination of a lower lightly doped $n^-$-type layer 12 and an upper heavily doped $n^+$-type layer 14 and the drain region formed by the combination of a lower lightly doped $n^-$-type layer 16 and an upper heavily doped $n^+$-type layer 18. Over the surface of such a substrate 10 is provided a polysilicon gate electrode 20 which overlies the substrate 10 across a gate oxide layer 22 and which is embedded in an insulator layer 24 of silicon oxide. Source and drain contacts 26 and 28 of metal extend to the surfaces of the upper heavily doped $n^+$-type layers 14 and 18 of the source and drain regions 12/14 and 16/18, respectively, through holes formed in the silicon oxide insulator layer 24. The lower lightly doped $n^{31}$-type layer 12 of the source region 12/14 extends beyond the edge of the upper heavily doped $n^+$-type layer 14 and emerges at the surface of the substrate 10 below one side marginal portion of the polysilicon gate electrode 20. Similarly, the lower lightly doped $n^{31}$-type layer 16 of the drain region 16/18 extends beyond the edge of the upper heavily doped $n^+$-type layer 18 and emerges at the surface of the substrate 10 below the other side marginal portion of the polysilicon gate electrode 20. The lower lightly doped $n^-$-type layer 16 forming part of the drain region 16/18 of this type of LDD device is useful for alleviating the field that would otherwise concentrate in the high-field regions between the gate electrode 20 and the drain region 16/18. The LDD features of the device shown are, thus, advantageous for increasing the drain breakdown voltage of the device and minimizing the injection of hot carriers into the oxide layer 22 adjacent the drain region 16/18.

The semiconductor structure shown in FIG. 2 is essentially similar in effect to the LDD MOSFET device shown in FIG. 1 and includes a p-type substrate 30 having a heavily doped $n^+$-type source region 32 and an "offset" drain region 34/36. The drain region consists of an ordinary heavily doped $n^+$-type portion 34 and a lightly doped $n^-$-type portion 36 extending from the $n^+$-type region 34 toward the source region 32. Over the surface of the substrate 30 is provided a polysilicon gate electrode 38 which overlies the substrate 30 across a gate oxide layer 40 and which is embedded in an insulator layer 42 of silicon oxide. Source and drain contacts 44 and 46 of metal extend to the surfaces of the heavily doped $n^+$-type source region 32 and the heavily doped $n^+$-type portion 34 of the drain region 34/36, respectively, through holes formed in the silicon oxide insulator layer 42. The lightly doped $n^-$-type portion 36 of the drain region 34/36 terminates below one side edge of the polysilicon gate electrode 38 with the result that heavily doped $n^+$-type portion 34 of the drain region 34/36 is offset from the gate electrode 38. It will be readily seen that the lightly doped $n^-$-type portion 36 forming part of the drain region 34/36 of this type of MOSFET device is also useful for alleviating the field in the high-field regions between the polysilicon gate electrode 38 and the drain region 34/36 and accordingly for increasing the drain breakdown voltage of the device.

On the other hand, the semiconductor structure shown in FIG. 3 is a MOSFET device known as graded gate oxide (GGO) transistor. In this MOSFET device of the GGO configuration, a p-type substrate 50 having an ordinary heavily doped $n^+$-type source region 52 has a drain region implemented by a lightly doped $n^-$-type layer 54 formed underneath a field oxide layer 56. Over the surface of such a substrate 50 is provided a polysilicon gate electrode 58 which overlies the substrate 50 across a gate oxide layer 60 and which is embedded in an insulator layer 62 of silicon oxide. A source contact 64 of metal extends to the surface of the heavily doped $n^+$-type source region 52 through a hole formed in the silicon oxide insulator layer 62. The lightly doped $n^-$-type drain region 54 emerges at the surface of the substrate 50 below the polysilicon gate electrode 58 which in part overlaps the field oxide layer 56 as shown. The lightly doped $n^-$-type drain region 54 of the GGO type MOSFET device thus constructed is also useful for increasing the drain breakdown voltage of the device and minimizing the injection of hot carriers into the oxide layer 60 adjacent the drain region 54.

Thus, each of the known MOSFET devices of the described configurations is advantageous for increasing the drain breakdown voltage of the device. There are however some drawbacks inherent in such prior-art devices, the important ones of which include:

(1) the low transconductances ($g_m$) and accordingly low amplifier gains ($A_v$) due to the presence of the lightly doped $n^-$-type drain regions or portions 16 (FIG. 1), 36 (FIG. 2) and 54 (FIG. 3) which have doping concentrations of the order of, usually, $1 \times 10^{14}$ atoms/cm$^3$;

(2) the low amplifier gains which result from formation of inverted layers on the lightly doped $n^-$-type drain regions or portions 16, 36 and 54 as would be caused when the devices are in long use; and (3) the added complications of the fabrication process which include the steps required for the formation of the lightly doped $n^-$-type regions or portions abutting the heavily doped $n^+$-type regions or portions.

The goal of the present invention is to eliminate all these problems of prior-art MOS devices of the described natures and a process of fabricating such an improved insulated-gate field-effect semiconductor device.

DESCRIPTION OF THE PREFERRED EMBODIMENTS

Figure 4A:
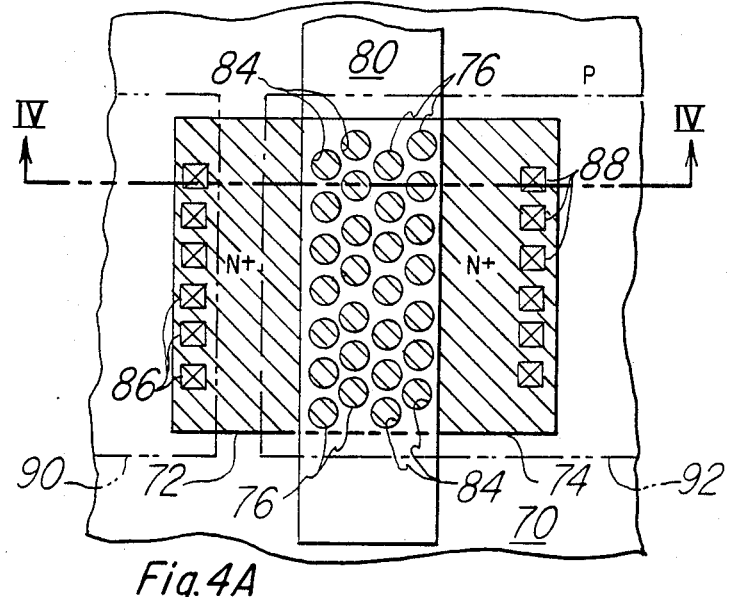
FIG. 4A is a fragmentary plan view showing a preferred embodiment of an insulated-gate field-effect semiconductor device according to the present invention.
Figure 4B:
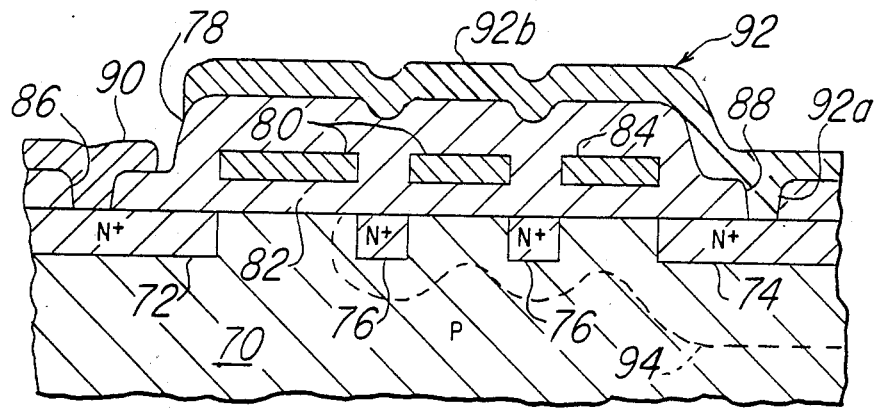
FIG. 4B is a sectional view taken along line IV—IV in FIG. 4A.

Referring to FIGS. 4A and 4B of the drawings, an insulated-gate field-effect semiconductor device embodying the present invention comprises a p-type monosilicon substrate 70 having formed therein two heavily doped $n^+$-type regions 72 and 74 which are spaced apart in parallel from each other along the surface of the substrate 70. In the MOSFET arrangement herein shown, these heavily doped $n^+$-type regions 72 and 74 are assumed to implement source and drain regions, respectively, of the transistor device. The silicon substrate 70 has further formed therein an array of heavily doped $n^+$-type island regions 76 which are distributed uniformly between the $n^+$-type source and drain regions 72 and 74 as shown. Each of the source and drain regions 72 and 74 and the island regions 76 is doped to a concentration within a range of, preferably, from $1 \times 10^{16}$ atoms/cm$^3$ to $1 \times 10^{18}$ atoms/cm$^3$ and is, as is customary, formed by ion implantation with a donor-type dopant such as arsenic or phosphorus.

On the surface of the silicon substrate 70 is formed an insulator layer 78 of, typically, silicon oxide having embedded therein a gate electrode region 80 of, typically, polysilicon extending along and between the source and drain regions 72 and 74 as will be seen from FIG. 4A. Thus, the silicon oxide insulator layer 78 forms a gate oxide layer 82 between the polysilicon gate electrode region 80 and the surface of the substrate 70 as shown in FIG. 4B. As will be better seen from FIG. 4A, the gate electrode region 80 is formed with a number of apertures 84 which are respectively aligned with the individual n+-type island regions 76 in the substrate 80 across portions of this gate oxide layer 82. The silicon oxide insulator layer 78 has formed therein a number of contact holes 86 extending to the surface of the source region 72 and a number of contact holes 88 extending to the surface of the drain region 74. Source and drain metallization layers 90 and 92 are deposited on the insulator silicon oxide layer 78. These source and drain metallization layers 90 and 92 in part extend into contact with the surfaces of the source and drain regions 72 and 74 through the contact holes 86 and 88, respectively, in the oxide layer 78 as shown. The metallization layer 92 associated with the drain region 74 in particular has a contact portion 92a which extends through the contact hole 88 to the surface of the drain region 72 and an overlap portion 92b which extends from the contact portion 92a. The overlap portion 92b of the drain metallization layer 92 overlays the drain region 74 and the entire channel region intervening between the source and drain regions 72 and 74. The island located 76 provided in the substrate 70 of the semiconductor device thus constructed are maintained in an electrically floating state with no electrical interconnects furnished therefor.

In operation, a depletion layer 94 is generated about the drain region 74 and each of the island regions 76 as indicated by a broken line in FIG. 4B at a drain voltage lower than a voltage which may cause avalanche breakdown in regions between the gate electrode region 80 and drain region 74. Punch-through is thus invited between the drain region 74 and each of the island regions 76 along the surface of the silicon substrate 70. The island regions 76 are distributed so that the distances between the drain region 74 and each of the island regions 76 facilitate punch-through therebetween. The depletion layer 94 thus produced in the substrate 70 lends itself to alleviating the concentration of the field in the regions between the gate electrode region 80 and drain region 74 so that the drain breakdown voltage is significantly increased. It should be noted that a drain breakdown voltage of as high as 80 volts to 100 volts is achieved with such a structure in contrast to a known MOSFET device in which drain breakdown voltage is, typically, 18 volts to 20 volts. The longitudinal geometry of the depletion layer 94 created in the substrate 70 as above and accordingly the drain breakdown characteristics of the device can be controlled by properly selecting the dose to be used for the diffusion of the donor-type dopant into the silicon substrate 70.

The insulated-gate field-effect semiconductor device embodying the present invention is further characterized in that the device is substantially free from the other problems inherent in prior-art MOSFET devices, viz., the low amplifier gains achievable by the devices and the complicated process steps required for the fabrication of the devices. This additional feature results from eliminating the lightly doped region or portion in or associated with the heavily doped n+-type drain region 74. Thus, the device according to the present invention is advantageous over prior-art devices not only for its increased drain breakdown voltage range but also for its enhanced reliability achieved by eliminating a fabrication step. It may also be noted that each of the island regions 76 of the device embodying the present invention functions as a low resistance element when the device is in conduction state. The presence of such low resistance elements will contribute to reducing the channel length effective in the substrate 70 and accordingly to further increase the amplifier gain of the device which functions as a transistor.

Meanwhile, it is well known in the art that drain breakdown can be controlled by selecting the doping concentration of the silicon substrate and/or the depth to which the dopant forming the drain region is diffused into the substrate. Generally, the use of deeper diffusion of a dopant forming a drain region and/or a lower doping concentration for the substrate results in the larger capacity to withstand high voltages and accordingly in the less likelihood of the device having drain breakdown.

The concentrated generation of field between the gate electrode region 80 and drain region 72 is further alleviated by the overlap portion 92b of the drain metallization layer 92 which overlies the total channel region between the source and drain regions 72 and 74.

A field-effect semiconductor device according to the present invention is for these reasons useful for applications in which it is desirable to minimize drain voltage breakdown or generation of hot carriers and will thus be advantageously used as a high-voltage MOS transistor, a short-channel MOS transistor or a peripheral transistor for use in a dynamic or static random-access memory (RAM) device.

Figure 5A:
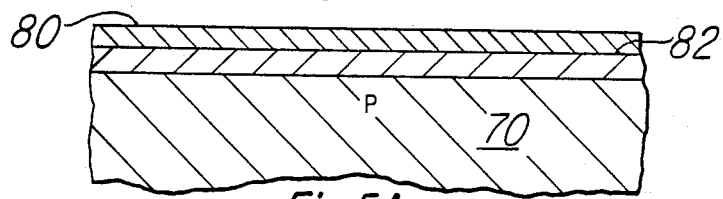
FIGS. 5A to 5C are fragmentary sectional views showing some of the successive steps of a process of fabricating a semiconductor device having the configuration shown in FIGS. 4A and 3B.
Figure 5B:
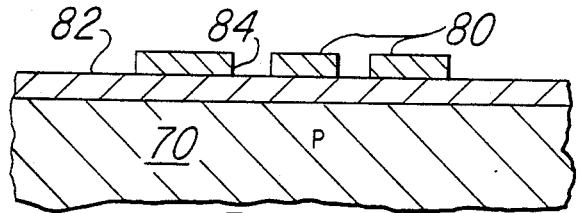
Figure 5C:
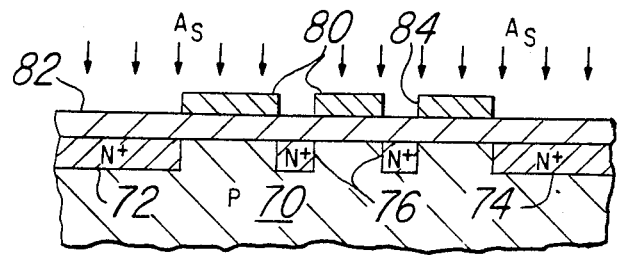

FIGS. 5A to 5C show some of the successive steps of a process of fabricating a semiconductor device having the configuration hereinbefore described with reference to FIGS. 4A and 3B.

The shown fabrication process starts with preparation of a p-type monosilicon substrate 70 as shown in FIG. 5A. It will be understood that this p-type monosilicon substrate 70 may be substituted with a p+-type silicon substrate having p−-type doped epitaxial layer formed on the surface of the substrate, though not shown in the drawings. As further shown in FIG. 5A, a thin silicon oxide film 82 is thermally grown, whereupon a thin doped polysilicon layer 80 is formed on the oxide film 82 by, for example, chemical vapor deposition (CVD) techniques which are well known in the art. The polysilicon layer 80 is microlithographically patterned and etched to leave a polysilicon gate electrode region 80 on the silicon oxide film 82. The pattern of the polysilicon gate electrode region 80 thus formed on the oxide film 82 is such that there is an array of apertures 84 distributed uniformly on the oxide film 82 as shown in FIG. 5B. A donor-type dopant such as for example arsenic is implanted into the silicon substrate 70 with the gate electrode region 80 used as a mask so that self-aligned n+-type regions 72, 74 and 76 are formed in the substrate 70 as shown in FIG. 5C. These n+-type regions 72, 74 and 76 are aligned with the apertures 84 in the gate electrode region 82 across the gate oxide layer 82 which intervenes between the substrate 70 and the gate electrode region 80 as shown. The n+-type regions 72 and 74 define the source and drain regions of the active transistor device to be fabricated and the n+-type regions 76 define island regions between these source and drain regions 72 and 74. The dosage for an ion implant to form these regions 72, 74 and 76 may have a concentration within a range of from $1 \times 10^{16}$ atom/cm$^3$ to $1 \times 10^{18}$ atom/cm$^3$ as mentioned previously. An insulator layer (not shown) of, for example, silicon oxide or phospho-silicate glass is then conformally deposited on the entire surface of the resultant structure and is selectively etched away to form a number of contact holes. As shown in FIG. 4A, these contact holes include contact holes 86 extending to the surface of the source region 72 and to the surface of the drain region 74. Source and drain metallization layers 90 and 92 of, for example, aluminum are then deposited on the insulator layer 78. As described previously with reference to FIGS. 4A and 4B, the source metallization layer 90 extends to contact the surface of the source region 72 through the contact hole 86 and the drain metallization layer 92 extends to contact with the surface of the drain region 74 through the contact hole 88 as shown. As also described previously, the metallization layer 92 for the drain region 74 has, in addition to a contact portion 92a, an overlap portion 92b overlaying the total area intervening between the source and drain regions 72 and 74.

Figure 6:
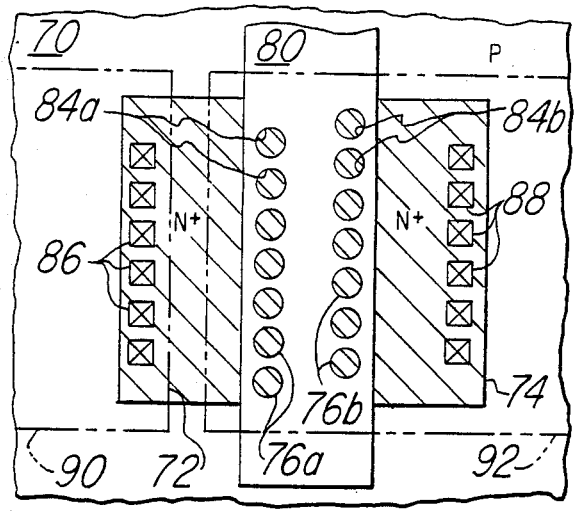
FIG. 6 is a fragmentary sectional view showing another preferred embodiment of an insulated-gate field-effect semiconductor device according to the present invention.
Figure 7:
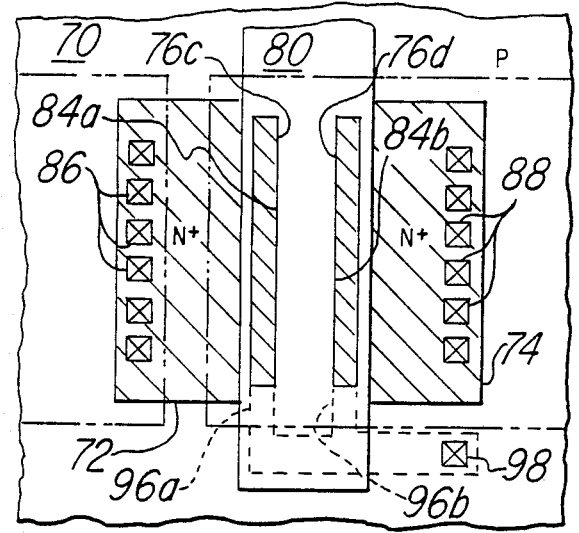
FIG. 7 is a view similar to FIG. 6 but shows still another preferred embodiment of an insulated-gate field-effect semiconductor device according to the present invention.
Figure 8:
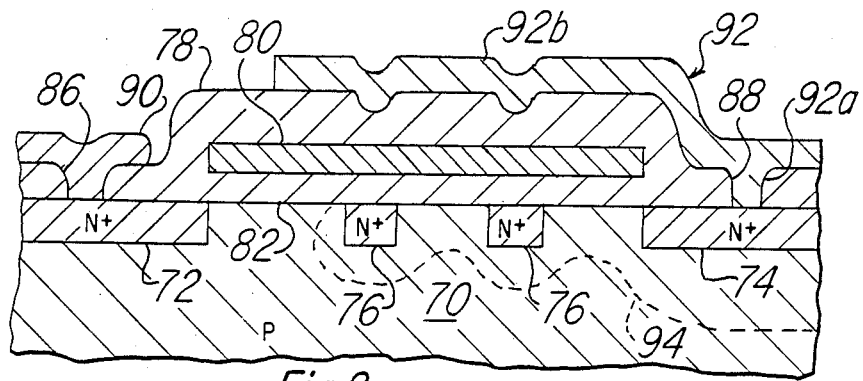
FIG. 8 is a view also similar to FIG. 6 but shows still another preferred embodiment of an insulated-gate field-effect semiconductor device according to the present invention.

The insulated-gate field-effect semiconductor device constructed as described with reference to FIGS. 4A and 4B and fabricated as hereinbefore described reflects an important aspect of the present invention but may be modified in numerous manners. FIGS. 6, 7 and 8 show a few examples of such modifications of the embodiment illustrated in FIGS. 4A and 4B. In each of FIGS. 6, 7 and 8, the structures, layers, regions and elements which are similar or corresponding to those of the embodiment f FIGS. 4A and 4B are represented by like reference numerals.

In the embodiment shown in FIG. 6, the apertures in the gate electrode region 80 are arranged in two linear arrays consisting of a single array of apertures 84a distributed along and in the vicinity of the n+-type source region 72 and a single array of apertures 84b distributed along and in the vicinity of the n+-type drain region 74. Accordingly, the heavily doped n+-type island regions formed in self-aligned relationship to these apertures 84a and 84b consists of island regions 76a distributed along and in the vicinity of the n+-type source region 72 and island regions 76b distributed along and in the vicinity of the n+-type drain region 74.

Furthermore, the apertures in the gate electrode region 80 in the embodiment shown in FIG. 7 consist of a single elongated slot or groove 84c extending along and in the vicinity of the n+-type source region 72 and a single elongated slot or groove 84d distributed along and in the vicinity of the n+-type drain region 74. Thus, the heavily doped n+-type island regions formed in self-aligned relationship to these slots or grooves 84c and 84d consists of a single elongated strip region 76c extending along and in the vicinity of the n+-type source region 72 and a single elongated strip region 76d extending along and in the vicinity of the n+-type drain region 74.

It will be understood that each of the semiconductor devices constructed as shown in FIGS. 6 and 7 is essentially similar in function to the embodiment of FIGS. 4A and 4B and can be fabricated using a process essentially similar to that described with reference to FIGS. 5A to 5C. If desired, the embodiment shown in FIG. 6 may be further modified so that the island regions are located only in the vicinity of the drain region 74 and, likewise, the embodiment shown in FIG. 7 may be modified so that there is only a single n+-type strip region located along and in the vicinity of the drain region 74, though not shown in the drawings.

On the other hand, the embodiment shown in FIG. 8 has island regions 76 arranged similarly to those of the embodiment described with reference to FIGS. 4A and 4B and thus distributed uniformly between the n+-type source and drain regions 72 and 74 as shown in FIG. 4A. The gate electrode region 80 in this embodiment is devoid of apertures in its overlap and extends continuously or in blind form over the area of the substrate 70 in which the island regions 76 are located between the source and drain regions 72 and 74.

In fabricating a device of this nature, the gate electrode 80 may be formed after the n+-type island regions 76 have been formed in the substrate 70 concurrently with or independently of the n+-type source and drain regions 72 and 74. In an example of such a fabrication process, a relatively thick oxide layer is first grown on the p-type silicon substrate and is patterned and etched to leave regions defining the island regions as well as the source and drain regions in the substrate. The remaining regions of the thick oxide layer are then used as a mask to inject a donor-type dopant such as arsenic into the silicon substrate to form the source and drain regions and the island regions in the substrate. The thick oxide regions are then removed from the substrate and, in turn, a fresh thin oxide film to provide a gate oxide layer is thermally grown on the substrate. Doped polysilicon is then deposited on the surface of the resultant structure typically by chemical vapor deposition techniques and is patterned and etched to leave a region over the area of the substrate intervening between the source and drain regions. An insulator layer is then formed on the semiconductor structure as a whole and is selectively etched away to form contact holes, whereupon source and drain metallization layers are formed in a manner described previously with reference to FIGS. 4A and 4B. If desired, the embodiment shown in FIG. 8 may be further modified so that the island regions 76 are substituted for by island regions 76a and 76b arranged in two linear parallel arrays as in the embodiment of FIG. 6 or by two elongated strip regions 76c and 76d as in the embodiment of FIG. 7.

It has been assumed that the island regions provided in the substrate in each of the described embodiments is maintained in an electrically floating state with no electrical interconnects provided therefor. If desired, however, the island regions in an insulated-gate field-effect semiconductor device according to the present invention may be commonly connected to a supply source of a suitable voltage such as a reverse bias voltage with respect to the p-type silicon substrate 70. Application of such a reverse bias to the island regions will make it easier to control the topography of the depletion layer 94 to be formed in the substrate 70 as described with reference to FIGS. 4A and 4B and will thus provide further improved drain breakdown voltage characteristics of the device. In the embodiment of FIG. 7, for example, the elongated strip regions 76c and 76d extending along the n+-type source and drain regions 72 and 74 may thus be extended along the width of the channel region as indicated at 96a and 96b, respectively. A metallization layer (not shown) is provided through a contact hole 98 formed in the top level insulator layer to provide an electrical interconnect from a supply source of a suitable voltage to the n+-type strip regions 76c and 76d.

The source and drain regions 72 and 74 and the island regions 76 (or island regions 76a and 76b or 76c and 76d) have been assumed to all be doped to a concentration within the range of $1 \times 10^{16}$ atoms/cm$^3$ to $1 \times 10^{18}$ atoms/cm$^3$ as mentioned previously. To provide further ease of controlling the drain breakdown voltage characteristics of the device, the island regions of a device according to the present invention may be doped to a concentration higher or lower than the doping concentration selected for the source and drain regions 72 and 74 of the device.

What is claimed is:

1. An insulated-gate field-effect semiconductor device comprising:
   (a) a semiconductor layer of a first conductivity type, the semiconductor layer having a surface portion;
   (b) heavily doped source and drain regions of a second conductivity type in said semiconductor layer, said source and drain regions being spaced apart from each other along the surface portion of said semiconductor layer;
   (c) a plurality of heavily doped island regions of said second conductivity type in said semiconductor layer, the plurality of heavily doped island regions located between and spaced apart from said source and drain regions, said island regions occupying locations disposed transversely of the direction between said source and drain regions;
   (d) an insulating layer on said surface portion;
   (e) a conductive layer overlaying said insulating layer and electrically isolated from said island regions, said conductive layer extending between said source and drain regions and said conductive layer having a plurality of closed boundary apertures aligned with individual ones of said island regions in said semiconductor layer.

2. The insulated-gate field-effect semiconductor device as set forth in claim 1 in which said plurality of island regions are elongate strips, at least one of said elongate strips located in the vicinity of said drain region, and extending transversely of the direction between said source and drain regions.

3. The insulated-gate field-effect semiconductor device as set forth in claim 1, in which said conductive layer is embedded within said insulating layer.

4. The insulated-gate field-effect semiconductor device as set forth in claim 1, in which said island regions form an elongate array comprising spaced apart rows extending transversely of a direction between said source and drain regions, each row comprising a plurality of island regions.

5. The insulated-gate field-effect semiconductor device as set forth in claim 3, further comprising a metallization layer overlaying said insulating layer, said metallization layer providing a drain region contact and extending from said drain region to a near portion of said source region.

6. An insulated-gate field-effect semiconductor device comprising:
   (a) a semiconductor layer of a first conductivity type, the semiconductor layer having a surface portion;
   (b) heavily doped source and drain regions of a second conductivity type in said semiconductor layer, the second conductivity type being opposite to said first conductivity type, said source and drain regions being spaced apart from each other along the surface portion of said semiconductor layer;
   (c) a plurality of island regions of said second conductivity type in semiconductor layer, the heavily doped island regions being spaced apart from said source and drain regions in the area of said semiconductor layer which intervenes between said source and drain regions, and occupying locations disposed transversely of the direction between said source and drain regions;
   (d) a gate insulation layer on said surface portion, and
   (e) a conductive layer electrically isolated from said island regions and having a portion on said gate insulation layer, said portion of the conductive layer being substantially coextensive with the area of said semiconductor layer which intervenes between said source and drain regions and said conductive layer has closed boundary apertures substantially aligned with respective ones of said island regions in said semiconductor layer.

7. The insulated-gate field-effect semiconductor device as set forth in claim 6, in which said conductive layer is extensive substantially throughout said area of said semiconductor layer.

8. The insulated-gate field-effect semiconductor device as set forth in claim 6, in which said island regions are distributed substantially uniformly throughout said area of said semiconductor layer.

9. The insulated-gate field-effect semiconductor device as set forth in claim 6, in which said island regions are located in at least two linear arrays, a first one of the at least two linear arrays having island regions located along and in the vicinity and spaced apart from one of said source and drain regions and a second one of the at least two linear arrays having island regions located along and in the vicinity of the other of said source and drain regions.

10. The insulated-gate field-effect semiconductor device as set forth in claim 6, further comprising a metallization layer providing a drain region contact and having a portion overlapping said conductive layer and said area of said semiconductor layer which intervenes between said source and drain regions.

11. The insulated-gate field-effect semiconductor device as set forth in claim 5, further comprising conductive means providing electrical connection between said island regions and a supply source of a predetermined voltage.

12. An insulated-gate field-effect semiconductor device comprising:
   (a) a semiconductor layer of a first conductivity type, the semiconductor layer having a surface portion;
   (b) heavily doped source and drain regions of a second conductivity type in said semiconductor layer, said source and drain regions being spaced apart from each other along the surface portion of said semiconductor layer;
   (c) a plurality of heavily doped island regions comprising elongate strips of said second conductivity type in said semiconductor layer, said elongate strips located between and spaced apart from said source and drain regions, said elongate strips extending transversely of the direction between said source and drain regions;
   (d) an insulating layer on said surface portion;
   (e) a conductive layer overlaying said insulating layer and electrically isolated from said island regions, said conductive layer extending between said source and drain regions and said conductive layer having a plurality of closed boundary apertures aligned with individual ones of said island regions in said semiconductor layer.

13. The insulated gate field-effect semiconductor device as set forth in claim 1, in which said island regions and said closed boundary apertures have substantially circular boundaries.

14. The insulated gate field-effect semiconductor device as set forth in claim 6, in which said island regions and said closed boundary apertures have substantially circular boundaries.

15. The insulated-gate field-effect semiconductor device as set forth in claim 12 further comprising conductive means providing electrical connection between at least one elongated strip and a supply source of a predetermined voltage.

* * * * *